United States Patent [19]

Nollet

[11] Patent Number: 4,599,577
[45] Date of Patent: Jul. 8, 1986

[54] TRANSISTORIZED AMPLIFICATION STAGE WITH IMPROVED POLARIZATION DEVICE

[75] Inventor: Michel Nollet, Noisy le Roi, France

[73] Assignee: Thomson CSF, Paris, France

[21] Appl. No.: 705,705

[22] Filed: Feb. 26, 1985

[30] Foreign Application Priority Data

Feb. 28, 1984 [FR] France ............................ 84 03032

[51] Int. Cl.⁴ ............................................ H03F 1/30
[52] U.S. Cl. .................................... 330/290; 330/296
[58] Field of Search ............. 330/9, 10, 207 A, 207 R, 330/250, 251, 290, 296

[56] References Cited
FOREIGN PATENT DOCUMENTS 3020313 12/1981 Fed. Rep. of Germany .
7611476 11/1976 France .
56-69907 6/1981 Japan .

Primary Examiner—Eugene R. LaRoche
Assistant Examiner—Steven J. Mottola
Attorney, Agent, or Firm—Cushman, Darby & Cushman

[57] ABSTRACT

In a transistorized amplification polarization device the polarization current of the collector of each amplification transistor of the stage is maintained at a constant value by means of a comparing circuit adapted to compare a collector polarization current image signal to a reference signal. The error signal result from such comparision is used as a control signal for controling a current chopping regulator supplying the polarization power for the base of the amplification transistor.

4 Claims, 2 Drawing Figures

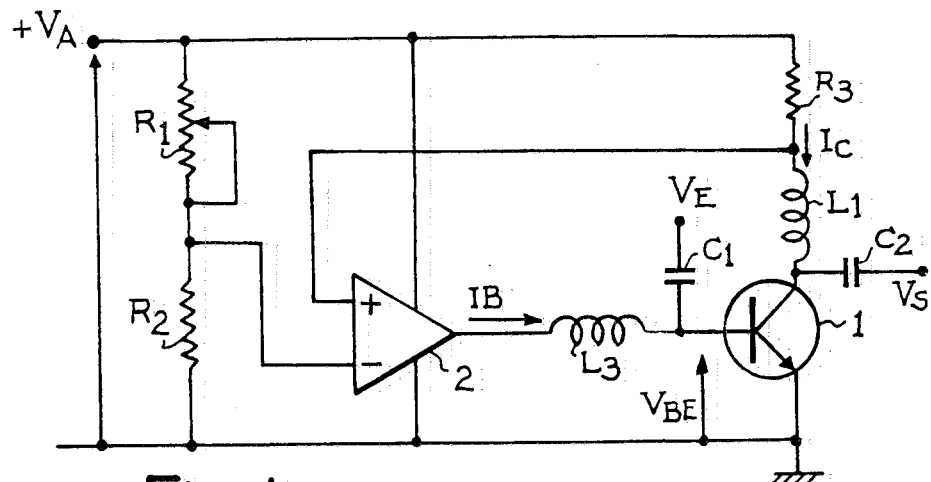
Fig.1 PRIOR ART
Fig.2
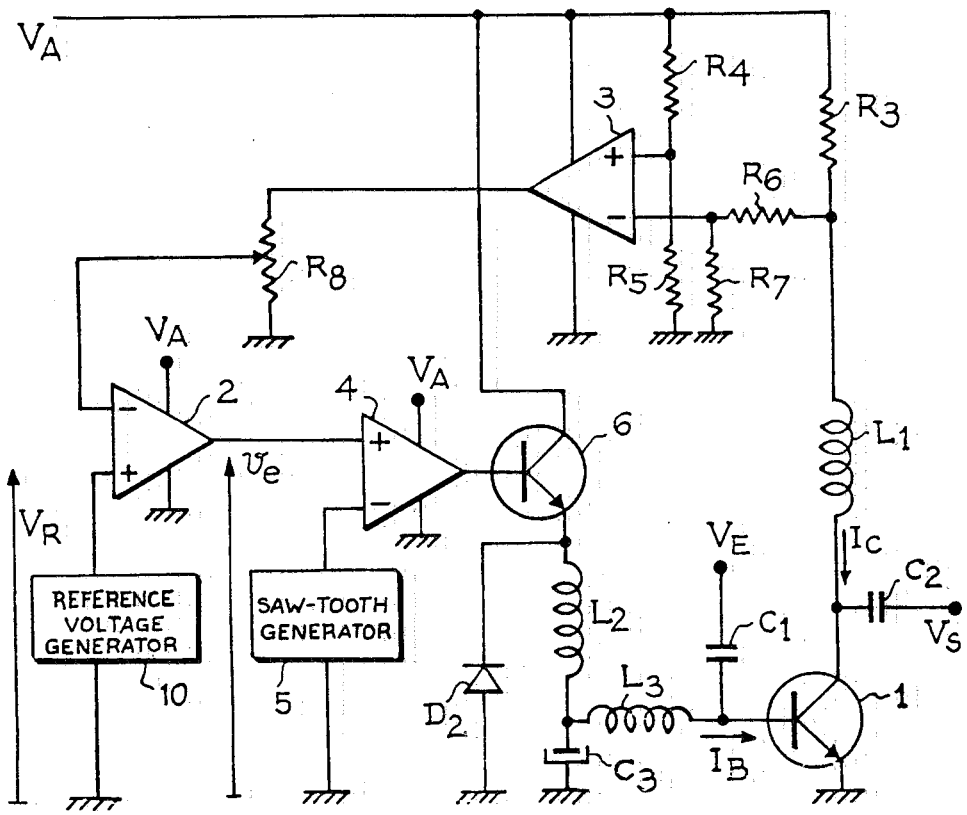

TRANSISTORIZED AMPLIFICATION STAGE WITH IMPROVED POLARIZATION DEVICE

BACKGROUND OF THE INVENTION

The present invention is related to transistorized amplification stages and more particularly to polarization circuits thereof.

The amplification stages used, for example, in television emitters or transposers consume a certain amount of energy, a certain proportion of such energy being consumed by the polarization circuit. The aim is to reduce the energy consumption of such equipment, particularly in two important cases, to wit:
- on the one hand, when the equipment is low-power equipment and has low energy consumption while the cost of energy is very high, for example at isolated locations where the energy is provided by solar cells, windmill generators or the like, a reduction in consumed energy results substantially in a reduction of the operating cost; and
- on the other hand when the equipment is high-power equipment and has high energy consumption, a reduction in energy results in a reduction of dissipated thermal energy, which entails mainly a reduction in the manufacturing and installation cost (ventilation and air conditioning).

With this purpose in view it is, first of all, possible to improve the yield of the feeding means, but it is not possible to go very far in this direction. When yield rates near the possible limit-values are reached, i.e. between 80 and 90% each improvement increment of such yield rate leads to increase considerably the manufacturing cost of the feeding means.

With a view to decrease the energy consumption of the equipment the invention proposes to improve the yield rate of the power amplifiers, since they constitute the part of the equipment which consumes the largest proportion of the energy fed thereto. Indeed in the power stages each amplifier is constituted by one or more HF transistors, for example by 64 transistors for producing 1 kilowatt in VHF. The yield of the amplifier is a function—amongst other parameters—of the selected amplification class. The requirements as to the quality of the amplified signal make it necessary to use amplification classes A or AB so as to avoid distortions. These amplification classes generally bring about a poor yield rate. Generally the class A amplifiers are constant collector current polarized amplifiers; for this purpose an image voltage of the collector current in the power transistor is compared in a comparator to a reference voltage obtained by means of a supply voltage divider. This comparator provides a base current that is controlled so that a constant collector current is obtained with a voltage equal to the supply voltage. The power yield rate of such a polarization stage is very low.

SUMMARY OF THE INVENTION

It is an object of the invention to provide a transistorized amplification stage polarization device for maintaining a constant polarization current in each transistor, said device comprising, for controlling each transistor, comparing means adapted to compare an image signal of the polarization current of the transistor to a reference signal, and a current chopping regulator interposed between the comparing means and the base of the transistor, said current regulator being controlled by the comparing means so as to deliver the polarization power for polarizing said base of the transistor, said polarization power being a function of the resulting error signal obtained at the output terminal of said comparing means.

The invention is also directed to the utilization of such polarization device in a transistorized amplification stage.

In other terms, the invention provides a polarization device for polarizing a transistorized amplification stage, wherein for each transistor of said stage a polarization current is maintained at a constant value by means of a comparing circuit adapted to compare an image signal of said polarization current to a reference signal, and wherein the error signal resulting from said comparison is used for producing a control signal for controlling a current chopping regulator supplying the polarization power for polarizing the base of said transistor.

BRIEF DESCRIPTION OF THE DRAWING

These and other objects, features and advantages of the invention will become more clearly apparent from the following description which refers to the appended drawing and is given by eay of illustration, but not of limitation.

In the drawings:

FIG. 1 shows a class A transistorized amplification stage polarized by a conventional polarization circuit;

FIG. 2 shows a transistorized amplification stage comprising a polarization device according to one embodiment of the invention.

DESCRIPTION OF THE PREFERRED EMBODIMENT

In FIG. 1 which illustrates the prior art a HF power transistor 1 has its emitter connected to earth and its collector connected to the positive voltage supply $+V_A$ through a shock self induction coil $L_1$ and a collector resistor $R_3$. The collector current is represented by $I_C$. The base of transistor 1 is connected through a shock self-induction coil $L_3$ to the output terminal of a comparator, the input terminal "+" of which is connected to the common point of $R_3$ and $L_1$ and the input terminal "−" of which is connected to the central or median point of a voltage divider provided between the ground and $+V_A$, and constituted by two resistors $R_1$ and $R_2$. The polarization current $I_B$ on the base of the HF transistor is such that the difference of potential between the comparator input terminals is maintained at zero, thus $$R_3 \times I_C = \frac{V_A \times R_1}{R_1 + R_2}$$

The constant current on the collector can be controlled by means of variable resistor $R_1$ which should be adjusted to the desired value $$I_C = \frac{R_1 \times V_A}{R_3(R_1 + R_2)}$$

The signal $V_E$ to be amplified is applied to the base of HF amplification transistor 1 through a capacitor $C_1$, and the collector of the HF transistor provides the output signal $V_S$ through a capacitor $C_2$.

Comparator 2 may be an operational amplifier, a differential amplifier or a rather simple circuit using only one or two transistors. All these circuits are known; their "power stage" which provides the base current $I_B$ for the HF transistor drains this current at a voltage $V_A$; thus it consumes an amount of power $P = V_A \times I_B$ while it only supplies a power p to the HF transistor:

$$p = V_{BE} \times I_B$$

The power yield rate of this polarization stage thus equals p/P, consequently when $V_A = 30$ Volts and $V_{BE} = 1$ volt, the yield rate is about 3.3%.

Similarly the ratio of the power consumed by the polarization circuit of the useful power consumed by the HF transistor generally reaches a level of several percent and, in the above-described conditions, i.e. when the cost of power or energy is high, these few percent can entail a considerable increase of equipment operating expenses.

By way of example, considering the above indicated values of $V_A$ and $V_{BE}$, when the static current gain $\beta$ of the HF transistor equals 20 the ratio of the polarization power to the useful power is about 5% when $\beta = 50$, this ratio still is about 2%, and when $\beta = 100$, said ratio is about 1%.

FIG. 2 shows the transistorized amplification stage polarization device according to one embodiment of the invention. As in the preceding FIG. 1, FIG. 2 shwos the HF transistor 1 (NPN) which has its emitter connected to earth and its collector connected to the positive supply voltage source $V_A$ through a resistor $R_3$ connected in series with a shock self-induction coil $L_1$. Resistor $R_3$, as in the preceding case, allows the collector current to be "measured". To this end its two terminals are connected to the two input terminals of a voltage amplifier 3 through two resistor bridges, respectively $R_4$, $R_5$ disposed between the supply voltage source and the ground, its central or median point being connected to input terminal "+", and $R_6$, $R_7$ disposed between the other terminal of resistor $R_3$ and the ground, with its central or median point connected to input terminal "−" of the voltage amplifier. The output voltage of this amplifier thus is an amplified "image" voltage of the polarization current $I_C$ of the collector of the HF transistor. This output is connected to the ground through a rheostat $R_8$ the variable terminal of which is connected to the "−" input terminal of a comparator 2 analogous to the one used in the circuit shown in FIG. 1. A reference voltage $V_R$ issuing from a reference voltage generator 10 is applied to terminal "+" of comparator 2. The output terminal of comparator 2 thus supplies an error voltage $f_e$ on the basis of which the base current $I_B$ of the HF transistor will be controlled.

In the device according to the invention the output voltage of comparator 2 is not applied directly to the base of the HF transistor, but is applied thereto through a chop current circuit as follows: the output terminal of comparator 2 is connected to the "+" input terminal of a comparator 4 which receives at its input terminal "−" a saw-tooth shaped signal provided by a saw-tooth generator 5. The output terminal of said comparator is connected to the base of a chopping transistor 6 operating in the manner of a high-speed interrupter. The emitter of this transistor is connected to a self-induction chopping coil $L_2$ which is connected in series with a capacitor $C_3$ connected to ground. The common point of said self-induction chopping coil $L_2$ and said capacitor $C_3$ is connected to an HF shock self-induction coil $L_3$ the other terminal of which is connected to the base of transistor 1. Furthermore the emitter of chopping transistor 6 is also connected to ground through a regeneration diode $D_2$. The signal $V_E$ to be amplified is applied, furthermore, to the base of amplification transistor 1 through capacitor $C_1$ in a manner known per se, and the collector of the HF transistor provides the signal at output terminal $V_S$ through capacitor $C_2$.

Thus the polarization current for the base of transistor 1 is adjusted so that the collector current has a given value to which the reference voltage $V_R$ is associated; however this current is supplied by a chopping circuit the yield rate of which is about 80%.

Consequently the power p supplied to the base of the transistor 1, $p = I_B \cdot V_{BE}$ as according to FIG. 1, is now supplied by a polarization circuit in which the energy consumption is increased by only 20% as compared to the power supplied to the base of the transistor, whereas in the preceding example the polarization circuit consumed about 29 times the power supplied to the base. The ratio of the power consumed in a polarization circuit according to the invention to the power consumed in a conventional polarization circuit thus equals 3.3/80 = 4%, which means that the polarization circuit according to the invention consumes 96% less than a conventional circuit, whereby a substantial improvement of the global energy balance is obtained.

Thus, for a static gain $\beta = 20$ of the power transistor the ratio of the polarization power to the useful power is about 0.2%, as compared to 5% in accordance with the prior art; for a gain $\beta = 50$, said ratio decreases to 0.08% as compared to 2% in the prior art, and for a gain $\beta = 100$, said ratio amounts to only 0.04%, as compared to 1% in the prior art.

Such a device is obviously more advantageous as the number of transistors to be polarized in an amplification stage is elevated and the amount of consumed power is large, since in this case it is possible to substantially reduce the global power consumption.

The invention is not limited to the embodiment described in detail with reference to FIG. 2.

Thus, in particular, with a view to obtaining an image voltage of the polarization current $I_C$ a resistor has been represented as being associated to the collector of the amplification transistor. This resistor may be replaced with any other detecting means providing an image of the current or the polarization point, such as, for example, a Hall effect detector or a thermal detector. Furthermore, in accordance with FIG. 2 the resistor is associated to the collector; however it may also be associated to the emitter or the base of the amplification transistor, provided that the control or regulating function is effected with a constant base current.

Furthermore the reference signal compared to the image voltage of the polarization current to be controlled, in the circuit according to FIG. 2, may have a variable value, being, for example, proportional to the amplitude of the input signal $V_E$ to be amplified, or to any other signal, voltage, current or value, so as to modulate the polarization current of the amplification transistor in accordance with a signal or an event. Also, this reference signal may be a multiple signal. It may constituted, for example, by a double signal, defining a low reference below which the chopping transistor is shut off and a high reference above which the chopping transistor is actuated.

The comparator comparing the polarization current image voltage to be controlled to the reference signal may be a simple comparator or a threshold-value comparator, with or without hysteresis. In the example shown in FIG. 2, comparator 2 is an operational amplifier. The latter may be replaced by any convenient equivalent circuit.

The chopping circuit which, according to FIG. 2, produces constant frequency crenels with a cyclic ratio variable by the comparison of error signal $v_e$ and the constant frequency saw-tooth signal. This arrangement obviously is not limitative, and the chopping transistor may be controlled by a signal having square impulses of constant width and variable frequency, or square impulses of variable width and frequency, the mean value of the control signal being a linear or non-linear function of the error signal $v_e$. The interrupting organ producing the chopping effect may be constituted by any convenient circuit adapted to establish and interrupt a current flow.

The "power" circuit to which the current supplied by the supply means is applied via the interrupting organ or element, constitutes primarily an integration stage, comprising coil $L_2$ and capacitor $C_3$ in the embodiment according to FIG. 2. This circuit may be completed by supplementary circuits for adapting impedance values, for transforming power or for filtering.

Generally speaking, any known configuration of chop current supply systems or power converting systems may be adapted to be used in a transistorized amplification stage polarizing device according to the present invention.

The invention is applicable to any amplifier operating in accordance with Class A specifications, whatever the frequency or the configuration of the amplified signal may be.

The invention is not limited to the embodiment described and shown in the drawing; many modifications and variants can be envisaged by those skilled in the art within the spirit and scope of the invention as defined in the appended claims.

What is claimed is:

1. A transistorized amplification stage polarization device having a power supply and being provided for a transistorized amplification stage including at least one transistor having a base, a collector and an emitter, said device maintaining a constant polarization current in said at least one transistor of said transistorized amplification stage for controlling said at least one transistor, said device comprising:
   comparing means adapted to compare an image signal of the polarization current of said at least one transistor to a reference signal ($V_R$), and
   a chop current regulator interposed between the comparing means and the base of said at least one transistor, said current regulator being controlled by the comparing means so as to deliver the polarization power for polarizing the base of said at least one transistor said polarization power being a function of the resulting error signal obtained at the output of said comparing means.

2. A transistorized amplification stage polarization device having a power supply and being provided for a transistorized amplification stage including at least one transistor having a base, a collector and an emitter, said device maintaining a constant polarization current in said at least one transistor of said transistorized amplification stage for controlling said at least one transistor, said device comprising:
   comparing means adapted to compare an image signal of the polarization current of said at least one transistor to a reference signal ($V_R$), and
   a chop current regulator interposed between the comparing means and the base of said at least one transistor, said current regulator being controlled by the comparing means so as to deliver the polarization power for polarizing the base of said at least one transistor said polarization power being a function of the resulting error signal obtained at the output of said comparing means; and said current regulator comprising a current interrupting circuit interposed between the supply input and an integrating circuit having an output terminal which is connected to the base of said at least one transistor, said interruption circuit being controlled by a two-level signal, the mean component of which is characteristic of the error signal ($v_e$).

3. A device according to claim 2, wherein said regulator further comprises a signal generator with a view to forming the control signal for said interrupting circuit on the basis of said error signal.

4. A device according to any one of claims 1, 3 or 2, wherein said at least one transistor of said transistorized amplification stage is polarized with a constant collector current, said image signal being characteristic of current ($I_c$) of said collector.

* * * * *